(12) United States Patent
Choi et al.

(10) Patent No.: US 11,568,924 B2
(45) Date of Patent: Jan. 31, 2023

(54) STATIC RANDOM ACCESS MEMORY (SRAM) DEVICES AND METHODS OF OPERATING THE SAME

(71) Applicant: Samsung Electronics Co., Ltd., Suwon-si (KR)

(72) Inventors: Taemin Choi, Seoul (KR); Seongook Jung, Seoul (KR); Keonhee Cho, Seoul (KR)

(73) Assignees: Samsung Electronics Co., Ltd.; Industry Academic Cooperation Foundation, Yonsei University

( * ) Notice: Subject to any disclaimer, the term of this patent is extended or adjusted under 35 U.S.C. 154(b) by 0 days.

(21) Appl. No.: 17/332,004

(22) Filed: May 27, 2021

(65) Prior Publication Data
US 2022/0130453 A1 Apr. 28, 2022

(30) Foreign Application Priority Data
Oct. 27, 2020 (KR) .......................... 10-2020-0140697

(51) Int. Cl.
*G11C 11/412* (2006.01)
*G11C 11/418* (2006.01)
*G11C 11/419* (2006.01)

(52) U.S. Cl.
CPC .......... *G11C 11/412* (2013.01); *G11C 11/418* (2013.01); *G11C 11/419* (2013.01)

(58) Field of Classification Search
CPC .... G11C 11/412; G11C 11/418; G11C 11/419
USPC ........................................................ 365/154
See application file for complete search history.

(56) References Cited

U.S. PATENT DOCUMENTS

| | | | | |
|---|---|---|---|---|
| 5,986,923 | A | * 11/1999 | Zhang | ................... G11C 11/412 365/156 |
| 8,004,924 | B2 | * 8/2011 | Leomant | ............... G11C 11/413 365/229 |
| 8,018,788 | B2 | 9/2011 | Jung et al. | |
| 8,503,221 | B1 | * 8/2013 | Hobson | ................. G11C 11/412 365/154 |
| 8,654,575 | B2 | 2/2014 | Deng | |
| 8,824,197 | B2 | 9/2014 | Moriwaki | |
| 9,224,453 | B2 | 12/2015 | Jin et al. | |
| 9,355,710 | B2 | 5/2016 | Gong et al. | |
| 9,697,889 | B1 | 7/2017 | Klein et al. | |

(Continued)

FOREIGN PATENT DOCUMENTS

| KR | 101488166 B1 | 2/2015 |
|---|---|---|
| KR | 101907028 B1 | 10/2018 |

*Primary Examiner* — Sung Il Cho
(74) *Attorney, Agent, or Firm* — Myers Bigel, P.A.

(57) ABSTRACT

An integrated circuit memory device includes a static random access memory (SRAM) cell, and a charge storing circuit electrically coupled to the SRAM cell. A switching controller is provided, which is electrically coupled to the charge storing circuit. The switching controller and the charge storing circuit are collectively configured to save power by recycling charge associated with a bit line electrically coupled to the SRAM cell by: (i) transferring charge from the bit line to a charge storage node electrically coupled to source terminals of a pair of NMOS pull-down transistors within the SRAM cell upon commencement of a SRAM cell write operation, and then (ii) returning at least a portion of the charge to the bit line upon completion of the SRAM cell write operation.

20 Claims, 15 Drawing Sheets

(56) References Cited

U.S. PATENT DOCUMENTS

| | | | |
|---|---|---|---|
| 10,002,661 B2 | 6/2018 | Fritsch et al. | |
| 10,803,942 B1* | 10/2020 | Jung | H04L 9/3278 |
| 11,062,766 B2* | 7/2021 | Siddiqui | G11C 8/08 |
| 2003/0189221 A1* | 10/2003 | Takemura | G11C 11/412 |
| | | | 257/200 |
| 2011/0317476 A1* | 12/2011 | Deng | G11C 11/412 |
| | | | 365/230.06 |
| 2013/0170287 A1* | 7/2013 | Walsh | G11C 11/417 |
| | | | 365/154 |
| 2019/0043560 A1 | 2/2019 | Sumbul et al. | |
| 2019/0348110 A1 | 11/2019 | Sinangil et al. | |
| 2020/0082874 A1 | 3/2020 | Dozaka | |

\* cited by examiner

STATIC RANDOM ACCESS MEMORY (SRAM) DEVICES AND METHODS OF OPERATING THE SAME

REFERENCE TO PRIORITY APPLICATION

This application claims priority under 35 U.S.C. § 119 to Korean Patent Application No. 10-2020-0140697, filed Oct. 27, 2020, the disclosure of which is hereby incorporated herein by reference.

BACKGROUND

The inventive concept relates to integrated circuit memory devices and, more particularly, to SRAM devices and methods of operating SRAM devices.

Due to the demand of high integration and development of semiconductor processes, the widths, intervals, and/or heights of wiring lines included in an integrated circuit (IC) may be reduced and parasitic elements of the wiring lines may increase. In addition, a power supply voltage of the IC may be reduced to lower power consumption, and an operating speed may increase, so that influences of parasitic elements of the wiring lines on the IC may increase. In spite of the parasitic elements, a memory device manufactured by various semiconductor processes may be required to stably provide high performance in accordance with requirements of various applications. It may also be important to reduce energy consumption, and one of the most efficient methods of reducing energy consumption is reducing a voltage supplied to a system-on-chip (SoC) architecture.

SUMMARY

The inventive concept relates to an efficient static random access memory (SRAM) device, which reduces energy consumption during operations to manage data transfer and storage, and an operating method thereof.

According to an aspect of the inventive concept, there is provided an SRAM device, which includes a memory cell connected to a word line and bit lines intersecting the word line. A charge storage circuit is provided, which includes a switching transistor that is connected to the memory cell and controlled to selectively block connection between a ground and the memory cell (in accordance with a logic level of a gate signal) and accumulate charges at a charge storage node from at least one bit line among the bit lines when the connection between the ground and the memory cell is blocked. A switching controller is provided for controlling the charge storage circuit by, among other things, determining the logic level of the gate signal of the switching transistor.

According to an aspect of the inventive concept, there is provided an SRAM device including a charge storage circuit that shares charges with at least one of a first bit line and a second bit line, and includes a charge storage node that stores the charges when an electrical connection to a ground is blocked, and at least one memory cell sharing the charge storage node, the first bit line, and the second bit line.

According to another aspect of the inventive concept, there is provided a method of operating an SRAM device, which includes: (i) connecting a charge storage node that is connected to a memory cell on which a write operation is to be performed to at least one of a first bit line and a second bit line connected to the memory cell on which the write operation is to be performed before performing the write operation, (ii) blocking connection between the charge storage node and a ground, (iii) blocking connection between the first bit line and the second bit line and the charge storage node after blocking connection to the ground, (iv) performing a write operation on the memory cell on which the write operation is to be performed through the first bit line and the second bit line, (v) connecting at least one of the first bit line and the second bit line to the charge storage node after performing a write operation on the memory cell on which the write operation is to be performed, and (vi) at least partially precharging the first bit line and the second bit line.

An integrated circuit memory device according to another embodiment of the inventive concept includes a static random access memory (SRAM) cell connected to a word line (WL) and a pair of bit lines (BL, BLB). A charge storing circuit is provided, which is electrically coupled to the SRAM cell. The charge storing circuit includes a switching transistor electrically coupled between a charge storage node, which is electrically connected to the SRAM cell, and a ground reference line (GND). A switching controller is provided, which is electrically coupled to the charge storing circuit. The switching controller is configured to turn off the switching transistor during a write operation, while charge is transferred between a first of the pair of bit lines and the charge storage node.

According to some of these embodiments, the charge storage circuit includes a first write assist transistor, which is electrically coupled between the first of the pair of bit lines and the charge storage node. The switching controller is further configured to turn on the first write assist transistor to enable a forward transfer of the charge from the first of the pair of bit lines to the charge storage node. The switching controller is further configured to turn on the first write assist transistor upon completion of the write operation, to thereby enable a reverse transfer of the charge from the charge storage node to the first of the pair of bit lines. The switching controller may also be configured to turn off the first write assist transistor during a tail portion of the write operation. This write operation may commence when the word line switches from an inactive logic level to an active logic level, and terminate when the word line next switches from the active logic level to the inactive logic level. Advantageously, the SRAM cell may include first and second NMOS pull-down transistors having source terminals electrically connected to a drain terminal of the switching transistor. And, the source terminal of one of the first and second NMOS pull-down transistors and the drain terminal of the switching transistor may be electrically floated during a portion of the write operation.

An integrated circuit memory device according to an additional embodiment of the inventive concept includes a static random access memory (SRAM) cell connected to a word line and a pair of bit lines. A charge storing circuit is provided, which is electrically coupled to the pair of bit lines, a source terminal of a first NMOS pull-down transistor within the SRAM cell, and a source terminal of a second NMOS pull-down transistor within the SRAM cell. A switching controller is provided, which is electrically coupled to the charge storing circuit. This switching controller is configured to save power by recycling bit line charge, by driving the charge storing circuit with: (i) first signals that enable a forward transfer of charge from a first of the pair of bit lines to the source terminals of the first and second NMOS pull-down transistors during a portion of the write operation, and (ii) second signals that enable a reverse transfer of the charge to the first of the pair of bit lines upon completion of the write operation. In some embodiments, the source terminals of the first and second NMOS pull-down transistors are electrically floated during a portion of the write operation. The write operation may also commence during the forward transfer of charge from a first of the pair of bit lines to the source terminals of the first and second NMOS pull-down transistors. The charge storing circuit may also include a write assist transistor having a gate terminal responsive to a corresponding one of the first signals and a corresponding one of the second signals. This write assist transistor may electrically short the first of the pair of bit lines to the source terminals of the first and second NMOS pull-down transistors during the forward and reverse transfers of the charge.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
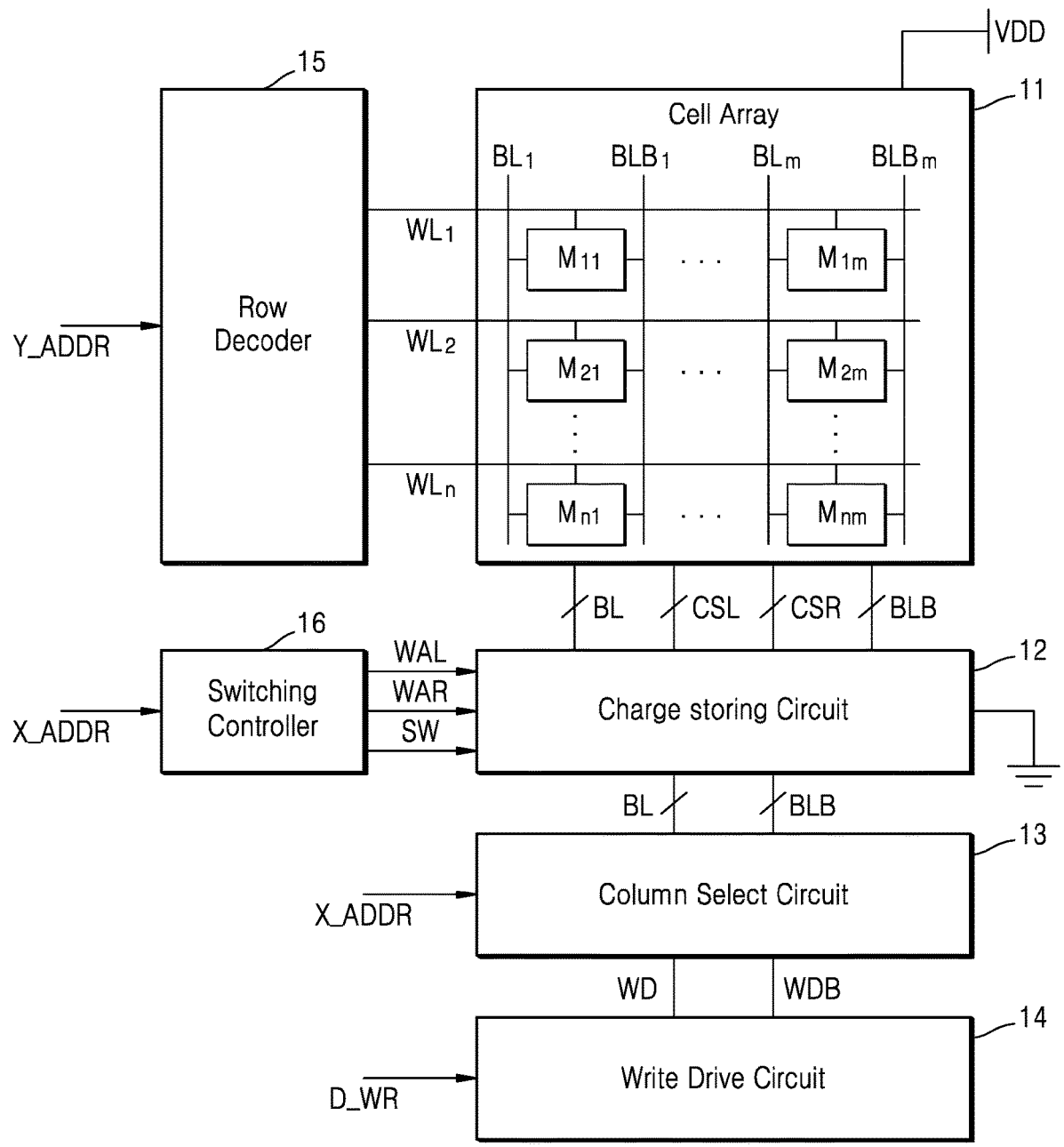
FIG. 1 is a block diagram of a static random access memory (SRAM) device according to an embodiment of the inventive concept.

FIG. 1 is a block diagram of a static random access memory (SRAM) device 10 according to an embodiment of the inventive concept. This SRAM device 10 may include a cell array 11, a charge storage circuit 12, a column selection circuit 13, a write drive circuit 14, a row decoder 15, and a switch controller 16. Although not shown in FIG. 1, in some embodiments, the memory device 10 may further include a readout circuit, a data buffer, an address decoder, and a data input and output circuit, for example.

The memory device 10 may receive a command, an address, and data from an external host device. As one example, the memory device 10 may receive a command instructing data to be written, an address of a memory cell in which data is to be written, and "write" data. In addition, the memory device 10 may receive a command instructing data to be read and an address, may read data stored in an area corresponding to the address, and may provide the data to the external host device. The memory device 10 may be manufactured by a semiconductor process and may be a stand-alone memory or an embedded memory manufactured with other components using a semiconductor process.

The cell array 11 may include a plurality of memory cells. According to an embodiment of inventive concept, the plurality of memory cells may be volatile memory cells such as SRAM or dynamic RAM (DRAM). In some embodiments, the plurality of memory cells included in the cell array 11 may be non-volatile memory cells such as flash memory or resistive RAM (RRAM). Exemplary embodiments of the inventive concept will be described mainly with reference to an SRAM cell in FIG. 2. However, exemplary embodiments of the inventive concept are not limited thereto.

Referring to FIG. 1, each of the plurality of memory cells included in the cell array 11 may be connected to one of first to nth word lines $WL_1$ to $WL_n$ (n is an integer greater than 1), which are sequentially arranged in the cell array 11, and each of the plurality of memory cells may be connected to a power source to which power for maintaining data is supplied after a write operation is performed. In addition, each of the plurality of memory cells included in the cell array 11 may be connected to at least one of a plurality of bit lines BLs. Some of the plurality of memory cells may be selected by activated word lines among the first to nth word lines $WL_1$ to $WL_n$. For example, m memory cells $M_{11}$ to $M_{1m}$ connected to the first word line $WL_1$ may be selected by the activated first word line $WL_1$ and, in accordance with states of the plurality of bit lines BLs, data (i.e., write data D_WR) may be written in the m memory cells $M_{11}$ to $M_{1m}$. Alternatively, signals corresponding to data (i.e., read data) stored in the m memory cells $M_{11}$ to $M_{1m}$ may be output through the plurality of bit lines BLs during a read operation.

The row decoder 15 may receive a row address Y_ADDR and may activate one of the first to nth word lines $WL_1$ to $WL_n$ in accordance with the row address Y_ADDR. In some embodiments, the memory device may include the address decoder and the address decoder may generate the row address Y_ADDR from the address received together with the command. In some embodiments, the memory device may further include a column decoder and the column decoder may select some of the plurality of bit lines BL based on a column address X_ADDR received from the address decoder. In some embodiments, the column decoder may be omitted and all the addresses received by the memory device may be provided to the row decoder 15 by the address decoder as the row address Y_ADDR.

The write drive circuit 14 may be connected to the column selection circuit 13 through a write drive line WD and a complementary write drive line WDB, and may determine a level of a voltage to be applied to the write drive line WD and the complementary write drive line WDB by receiving the write data D_WR. As an example, when the write drive circuit 14 receives the write data D_WR at a logic high level, a voltage at a logic high level may be applied to the write drive line WD and a voltage at a logic low level may be applied to the complementary write drive line WDB.

The column selection circuit 13 may receive the column address X_ADDR and may perform a switching operation for selecting a column indicated by the column address X_ADDR based on the column address X_ADDR. The column selection circuit 13 performing the switching operation may provide a voltage of the write drive line WD and the complementary write drive line WDB to a corresponding column through the plurality of bit lines BL. As an example, when the column address X_ADDR indicates a first column, the column selection circuit 13 may activate a first switch connected to a first bit line $BL_1$ and may transmit the voltage received from the write drive circuit 14 to the first bit line $BL_1$.

The switching controller 16 may receive the write data D_WR and the column address X_ADDR and may determine logic levels of a first write assist signal WAL, a second write assist signal WAR, and a switching signal SW based on the write data D_WR. The switching controller 16 may determine columns to which the first write assist signal WAL, the second write assist signal WAR, and the switching signal SW are to be applied in the charge storage circuit 12 based on the column address X_ADDR. The switching controller 16 according to the inventive concept is not limited thereto, and may perform a control operation for applying the first write assist signal WAL, the second write assist signal WAR, and the switching signal SW to the remaining columns excluding the column indicated by the column address X_ADDR. As an example, the switching controller 16 may apply the first write assist signal WAL and the second write assist signal WAR at logic low levels to the charge storage circuit 12 connected to the non-selective memory cells excluding the memory cell on which the write operation or a read operation is to be performed and may apply the switching signal SW at a logic high level.

The charge storage circuit 12 may determine whether to block connection between a ground and the memory cell based on the switching signal SW received from the switching controller 16. The charge storage circuit 12 may determine whether to receive charges from the plurality of bit lines BL based on the first write assist signal WAL and the second write assist signal WAR. A detailed operation of the charge storage circuit 12 according to the inventive concept will be described in detail with reference to FIG. 3.

Although not shown in FIG. 1, the SRAM device 10 may further include a command decoder receiving a command and may perform an operation related to the memory cells by decoding the command. For example, the command decoder may generate an activated write enable signal when the command corresponds to a write command and may deactivate the write enable signal and may output an activated read enable signal when the command corresponds to a read command.

The SRAM device 10 according to an embodiment of the inventive concept may receive charges from at least one bit line in accordance with the first write assist signal WAL and the second write assist signal WAR and may accumulate charges in a charge storage node by blocking connection between the ground and the charge storage node in accordance with the switching signal SW. The SRAM device 10 may precharge the plurality of bit lines BL by a small voltage by using the charges accumulated in the charge storage node in a process of precharging the plurality of bit lines BL to a logic high level after performing the write operation or the read operation. In a process of the SRAM device 10 pulling down a data storage area of a memory cell from a logic high level to a logic low level, the charges stored in the charge storage node may assist data to be easily written by weakening strength of a pull-up transistor pulling up the data storage area.

Figure 2:
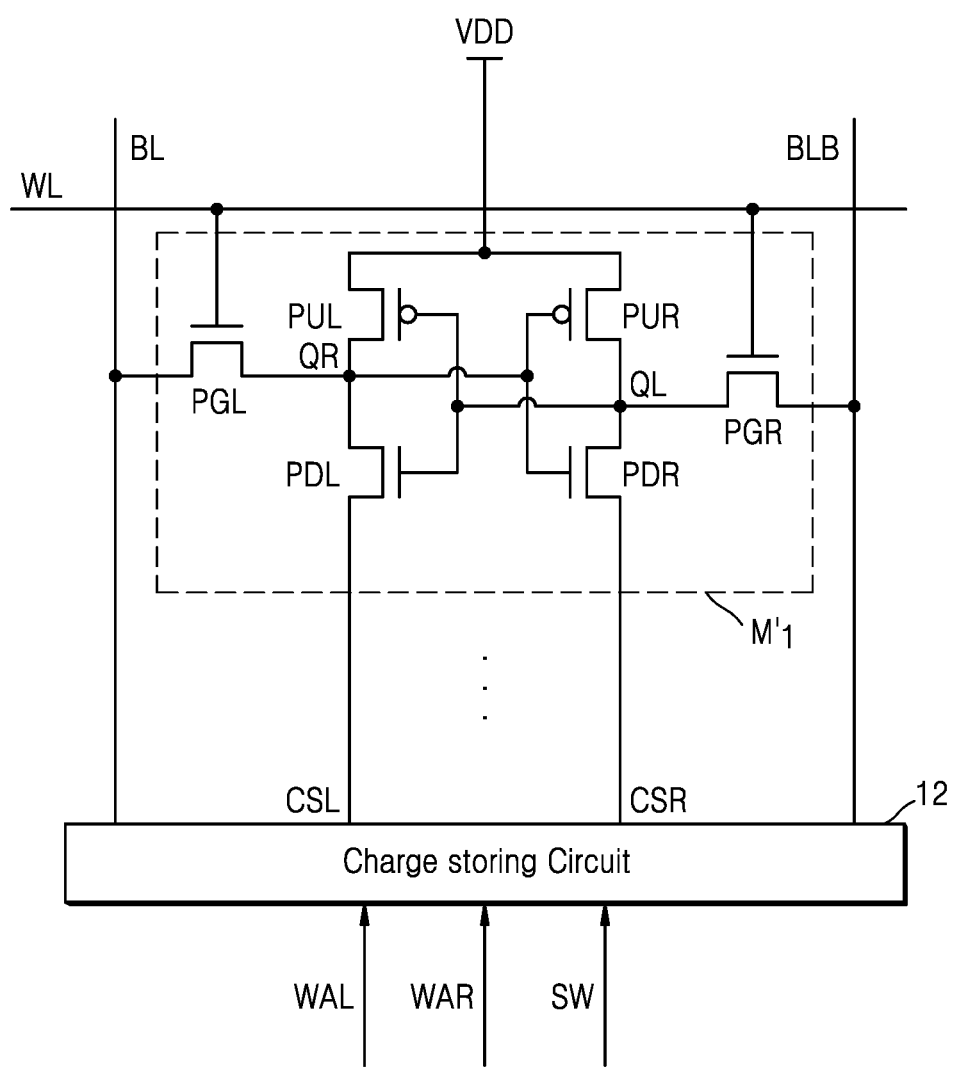
FIG. 2 is a circuit diagram illustrating a memory cell according to an embodiment of the inventive concept.

FIG. 2 is a circuit diagram illustrating an SRAM memory cell $M'_1$ according to an embodiment of the inventive concept. Referring to FIG. 2, the memory cell $M'_1$ according to the inventive concept may include six transistors: a first pass gate transistor PGL, a first pull-up transistor PUL, a first pull-down transistor PDL, a second pass gate transistor PGR, a second pull-up transistor PUR, and a second pull-down transistor PDR. In the memory cell $M'_1$ according to a comparative embodiment, the first pull-down transistor PDL and the second pull-down transistor PDR are directly connected to the ground. However, in the memory cell $M'_1$ according to an embodiment of the inventive concept, the first pull-down transistor PDL and the second pull-down transistor PDR are connected to the charge storage node through a first charge storage line CSL and a second charge storage line CSR; and these lines CSL and CSR may be selectively electrically coupled to ground via a switching transistor within the charge storing circuit 12, as explained more fully hereinbelow.

According to an embodiment, the plurality of bit lines BL may include a plurality of pairs of bit lines BL and the memory cell may be connected to a pair of bit lines BL. For example, the memory cell $M'_1$ may be connected to a pair of bit lines BL including a bit line BL and a complementary bit line BLB. When the SRAM device 10 performs the write operation, voltages at different logic levels may be applied to the bit line BL and the complementary bit line BLB. As an example, when a voltage at a logic low level is applied to the bit line BL, a voltage at a logic high level may be applied to the complementary bit line BLB.

Referring to FIG. 2, the memory cell $M'_1$ may be a 6T cell that is connected to a word line WL, the bit line BL, and the complementary bit line BLB. The bit line BL may be connected to one end of the first pass gate transistor PGL, and the complementary bit line BLB may be connected to one end of the second pass gate transistor PGR. In the first pass gate transistor PGL and the second pass gate transistor PGR, when the word line WL is activated, the voltages of the bit line BL and the complementary bit line BLB may be respectively applied to a first node QL and a second node QR of the memory cell $M'_1$. As an example, when the SRAM device 10 performs the write operation of '0' bit, the voltage at the logic low level may be applied through the bit line BL and the voltage at the logic high level may be applied through the complementary bit line BLB. When the first pass gate transistor PGL and the second pass gate transistor PGR are activated, in the first node QL of the memory cell $M'_1$, the voltage at the logic low level may be formed and, in the second node QR of the memory cell the voltage at the logic high level may be formed. Therefore, the SRAM device 10 may write data of '0' bit in the memory cell $M'_1$.

The memory cell $M'_1$ may include the first pull-up transistor PUL, the second pull-up transistor PUR, the first pull-down transistor PDL, and the second pull-down transistor PDR forming a pair of cross-linked (e.g., cross-coupled) inverters. As an example, when the write data of '0' bit is written in the memory cell $M'_1$, because the voltage at the logic low level is formed in the first node QL of the memory cell $M'_1$, the second pull-up transistor PUR may be activated and the second pull-down transistor PDR may be deactivated. Because the voltage at the logic high level is formed in the second node QR of the memory cell $M'_1$, the first pull-up transistor PUL may be deactivated and the first pull-down transistor PDL may be activated. Therefore, the written data may be continuously and stably maintained after the data is completely written in the SRAM device 10.

Figure 3:
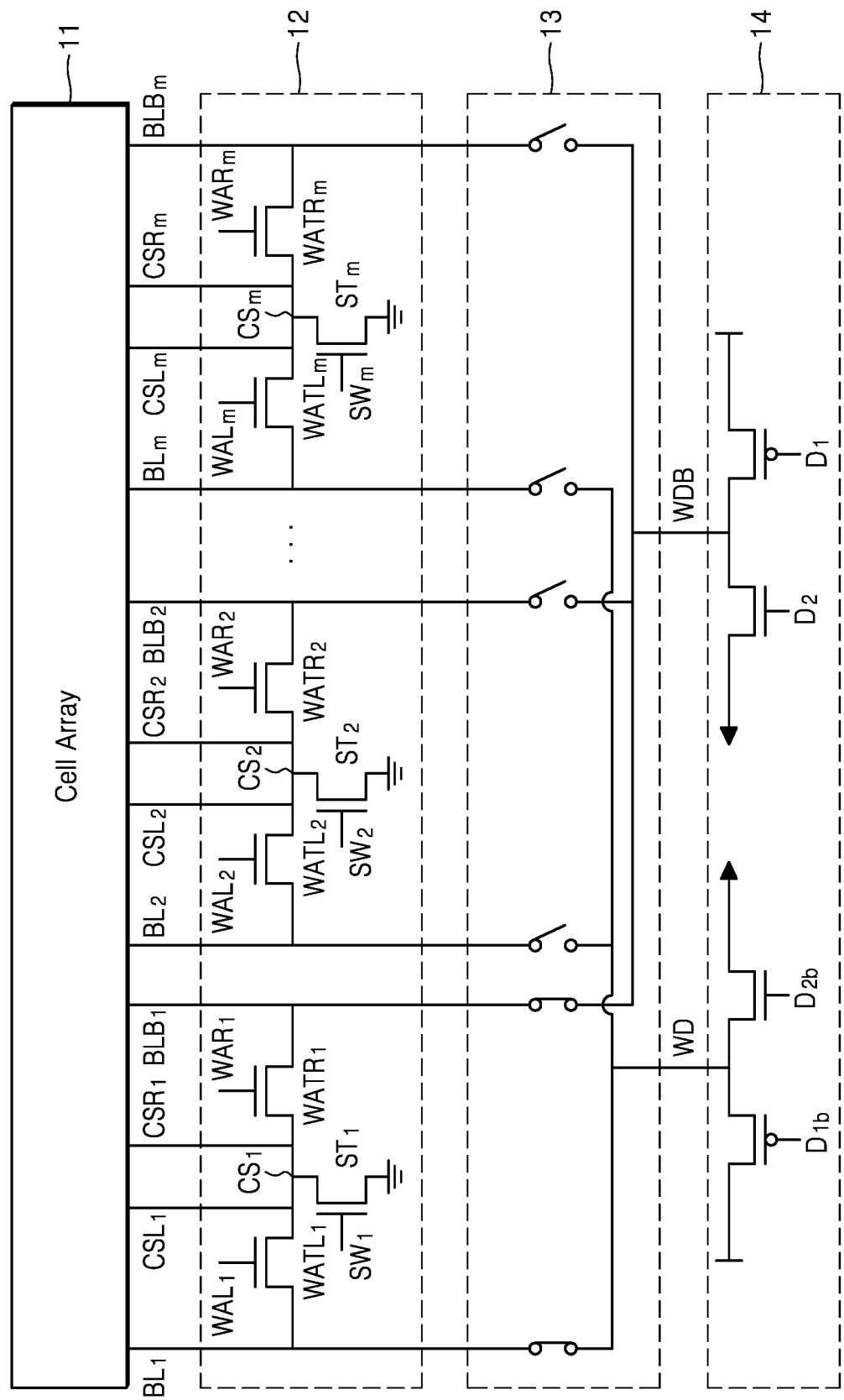
FIG. 3 is a circuit diagram illustrating a charge storage circuit, a column selection circuit, and a write drive circuit according to an embodiment of the inventive concept.

FIG. 3 is a circuit diagram illustrating: (i) a charge storage circuit 12, which is coupled to the cell array 11, (ii) a column selection circuit 13, and (iii) a write drive circuit 14, according to an embodiment of the inventive concept. Referring to FIG. 3, the SRAM device 10 may include the charge storage circuit 12, the column selection circuit 13, and the write drive circuit 14. The charge storage circuit 12 may be connected to each column of the cell array 11, and a voltage may be applied to the charge storage circuit 12 in accordance with the switching operation of the column selection circuit 13. As an example, the column selection circuit 13 in an embodiment of FIG. 3 may be controlled in order to apply voltages to the charge storage circuit 12 connected to each column and voltages generated by the write drive circuit 14 may be provided to the first charge storage circuit 12.

The charge storage circuit 12 may correspond to each column and may be connected to the cell array 11. As an example, when m columns are provided in the cell array 11, m charge storage circuits 12 may be connected to the cell array 11. The charge storage circuit 12 may include a switching transistor ST and at least one write assist transistor WAT. A first source/drain current carrying terminal of the switching transistor ST may be connected to memory cells of each column through at least one "left" or "right" charge storage line (i.e., CSL or CSR), and a second source/drain current carrying terminal that is not connected to the memory cells may be connected to a ground reference line (GND). Therefore, the switching transistor ST may determine whether to connect the memory cells to the ground in accordance with a logic level of a voltage applied to a gate terminal thereof. As an example, the switching transistor ST, which is shown as an NMOS transistor, may block connection between the memory cells and the ground when the corresponding switching signal SW at a logic low level (i.e., "inactive" level) is received at the gate terminal.

Referring to FIG. 3, the charge storage circuit 12 may include a first write assist transistor WATL and a second write assist transistor WATR. As shown, a source/drain end of each of the first write assist transistor WATL and the second write assist transistor WATR may be connected to the bit line BL and the complementary bit line BLB, respectively. However, a source/drain end, which is not connected to the bit line BL and the complementary bit line BLB, may be connected to the memory cells of the cell array 11 through the at least one charge storage line CSL or CSR. Therefore, the write assist transistor WAT may determine whether to connect the memory cells to the ground in accordance with the logic level of the voltage applied to the gate. As an example, when at least one of the first write assist transistor WATL and the second write assist transistor WATR receives the write assist signal at a logic high level, the charge storage circuit 12 (and charge storing node therein) may receive charges from one of the bit line BL and the complementary bit line BLB.

Referring to FIGS. 1 and 3, the column selection circuit 13 may receive a column address to perform the write operation in the cell array 11 and may perform the switching operation based on the column address. As an example, when the write operation is to be performed in the memory cell connected to a first column, the column selection circuit 13 may activate a connection between the bit line BL and the complementary bit line BLB of the first column and the write drive circuit 14 and may deactivate connection between the bit line BL and the complementary bit line BLB of each of the remaining columns excluding the first column and the write drive circuit 14.

The write drive circuit 14 may apply a voltage to the bit line BL and the complementary bit line BLB through a write drive line WD and a complementary write drive line WDB, respectively, which correspond to the bit line BL and the complementary bit line BLB. The write drive circuit 14 may apply a voltage at a logic level opposite to a logic level of a voltage to be applied to the bit line BL to the complementary bit line BLB. For example, when the write drive circuit 14 applies the voltage at the logic high level to the bit line BL, the transistors included in the write drive circuit 14 may be controlled in order to apply the voltage at the logic low level to the complementary bit line BLB.

Figure 4:
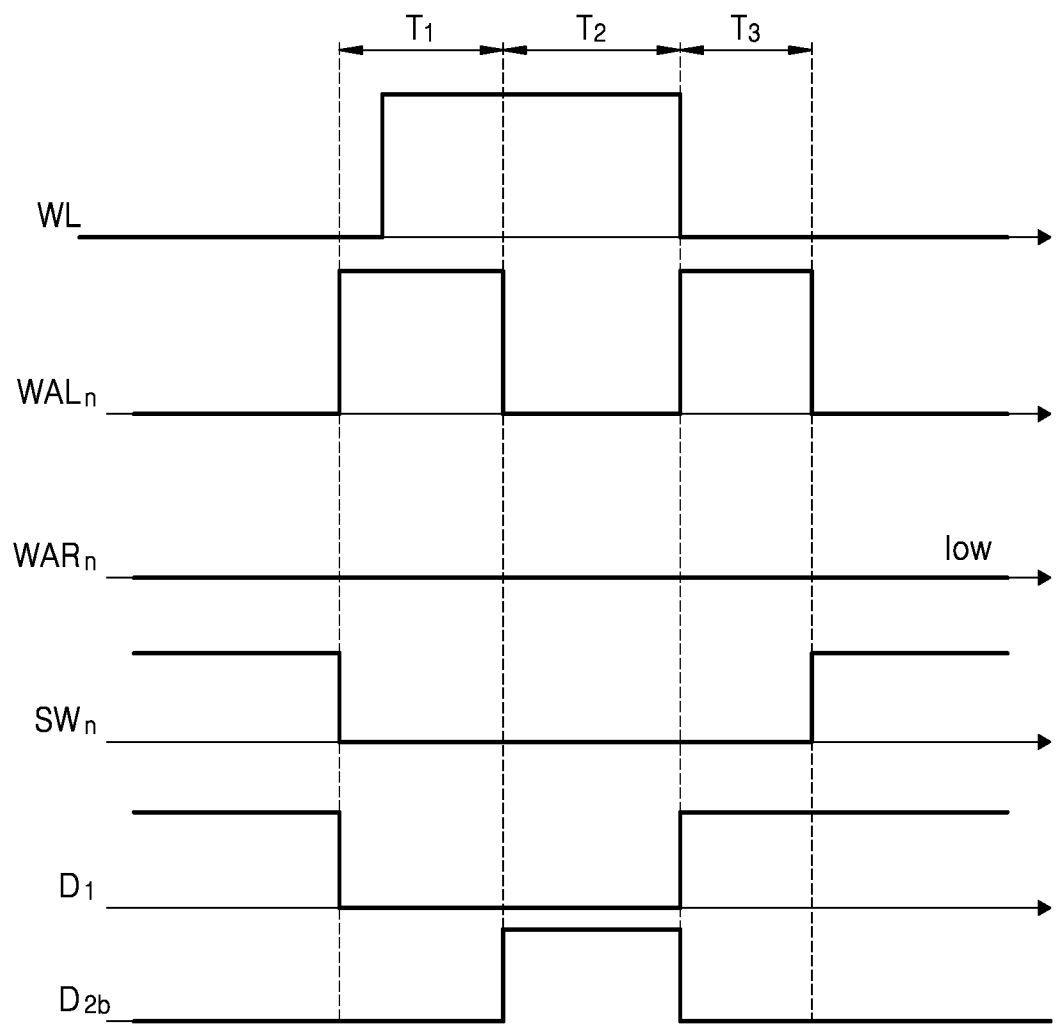
FIG. 4 is a graph illustrating levels of signals applied to an SRAM device in order to write data at a logic low level (e.g., "0"), according to an embodiment of the inventive concept.
Figure 5:
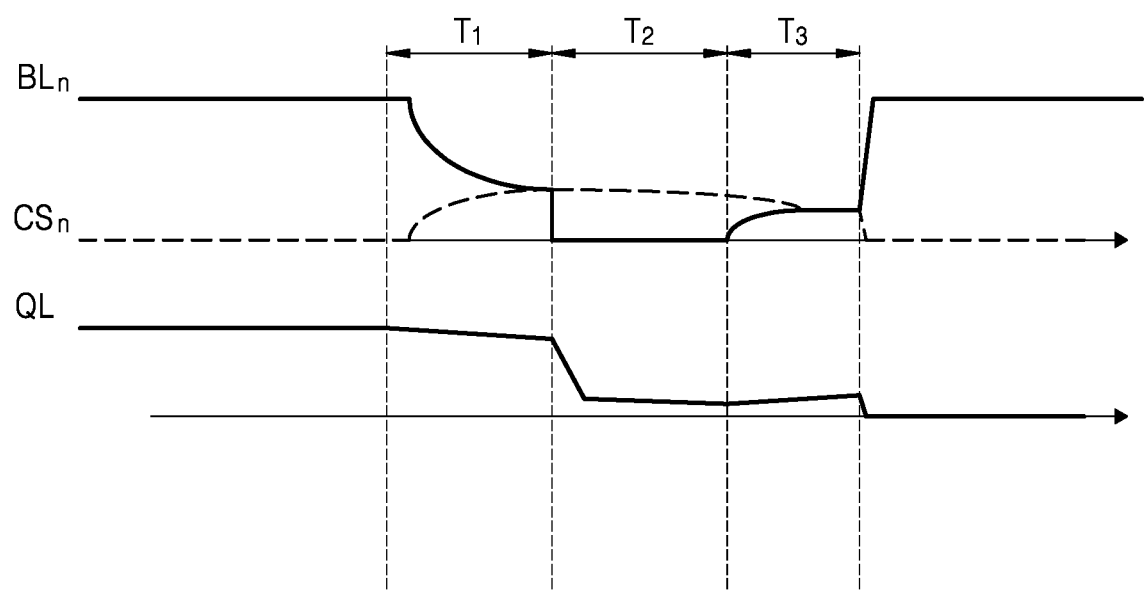
FIG. 5 is a graph illustrating levels of signals applied to a bit line, a charge storage node, and a data storage area of a memory cell according to an embodiment of the inventive concept.

FIG. 4 is a graph illustrating voltage levels of signals applied to the SRAM device 10 in order to write data at a logic low level "0" according to an embodiment of the inventive concept. FIG. 5 is a graph illustrating levels of signals applied to a bit line $BL_n$, a charge storage node $CS_n$, and a data storage area of a memory cell according to an embodiment of the inventive concept.

Referring to FIGS. 4 and 5, the SRAM device 10 may apply a word line selection voltage to a word line WL connected to a memory cell in which data is to be written in order to perform a write operation and may drop a voltage of one of a bit line $BL_n$ and a complementary bit line $BLB_n$, which is previously precharged to a logic high level, to a logic low level. At this time, the charge storage circuit 12 according to the inventive concept may perform a write assist operation (and power saving operation) by receiving charges from the line in which the voltage is dropped (between the bit line $BL_n$ and the complementary bit line $BLB_n$) and storing the received charges so they are not "lost" to the ground reference line GND.

In a first time interval T1, the SRAM device 10 may apply the word line selection voltage at a logic high level to the word line WL connected to the memory cell in which the data is to be written in order to perform the write operation and may float the charge storage node $CS_n$ by applying a switching signal $SW_n$ at a logic low level in order to perform the write assist operation. In a second time interval T2, the SRAM device 10 may block connection between the bit line $BL_n$ and the complementary bit line $BLB_n$ and the charge storage node $CS_n$ and may write the data of '0' bit to the memory cell in which the data is to be written by pulling down a voltage of the bit line $BL_n$ to a logic low level. In a third time interval T3, the SRAM device 10 may block connection between the memory cell in which the data is to be written and the bit line $BL_n$ and the complementary bit line $BLB_n$ and may activate connection between the charge storage node $CS_n$ and the bit line $BL_n$. Therefore, the SRAM device 10 may provide charges accumulated in the charge storage node $CS_n$ to the bit line $BL_n$ pulled down to the logic low level.

Figure 6:
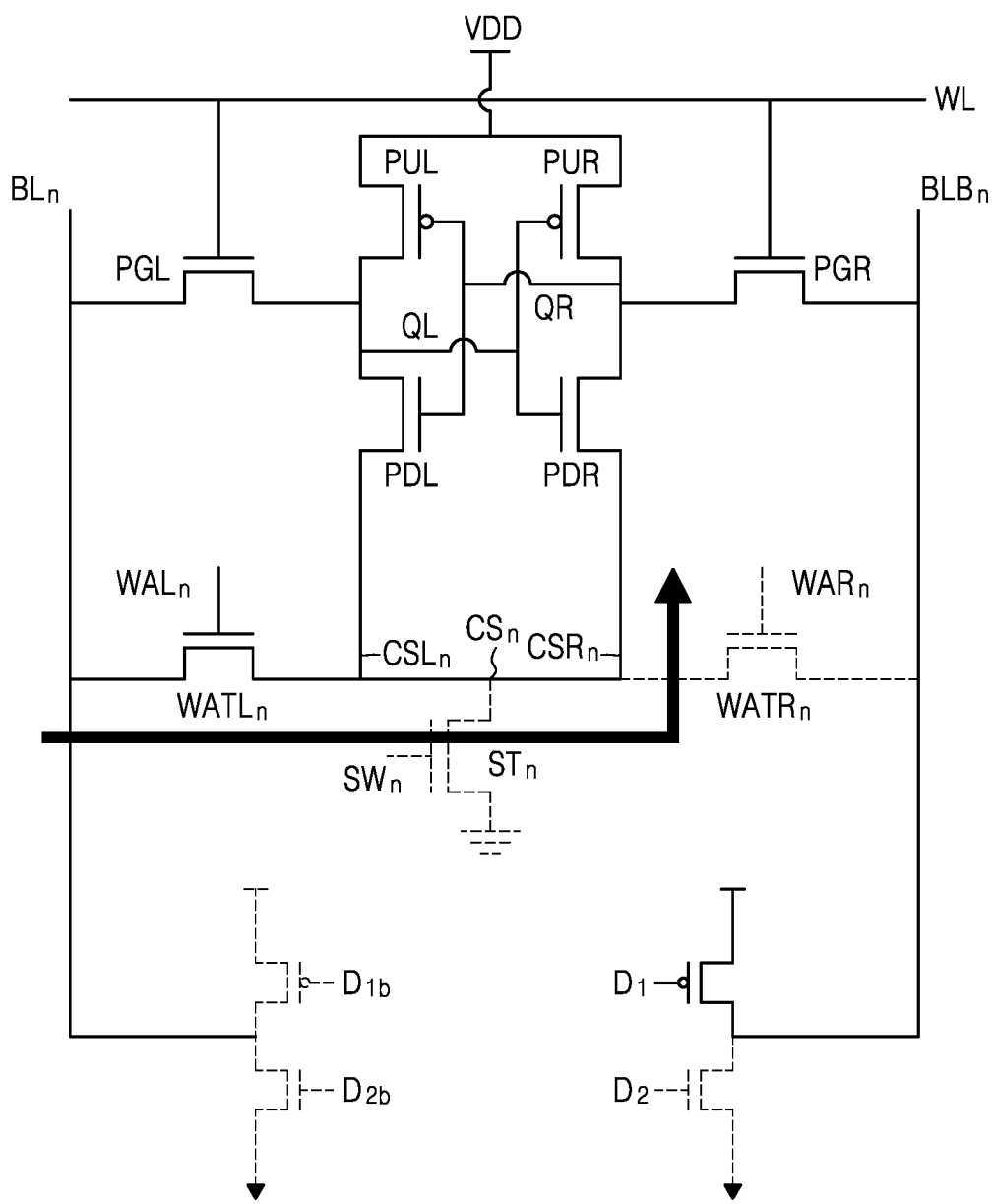
FIGS. 6 to 8 are circuit diagrams illustrating an operation of an SRAM device at first to third time intervals for writing data at a logic low level.
Figure 7:
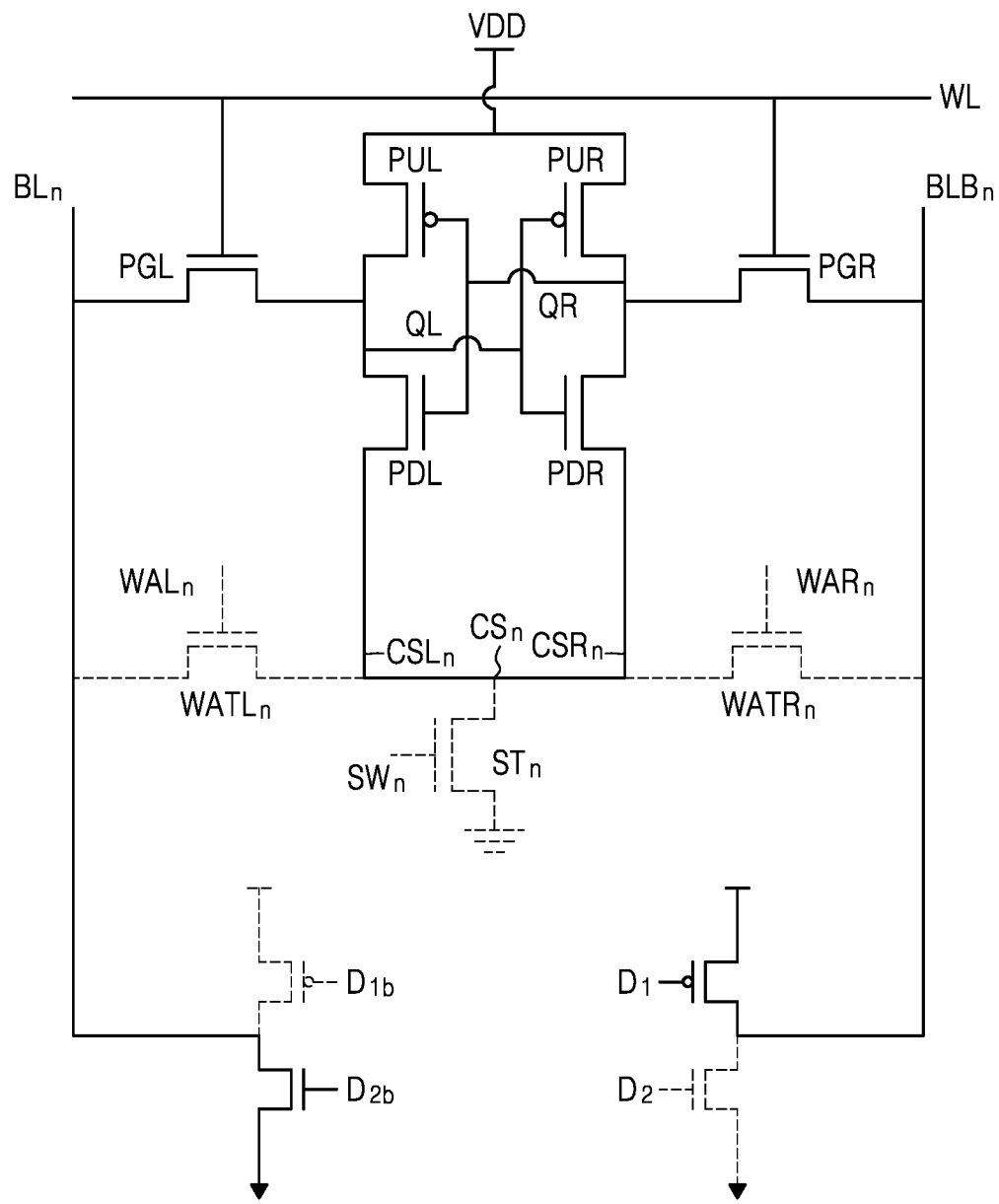
Figure 8:
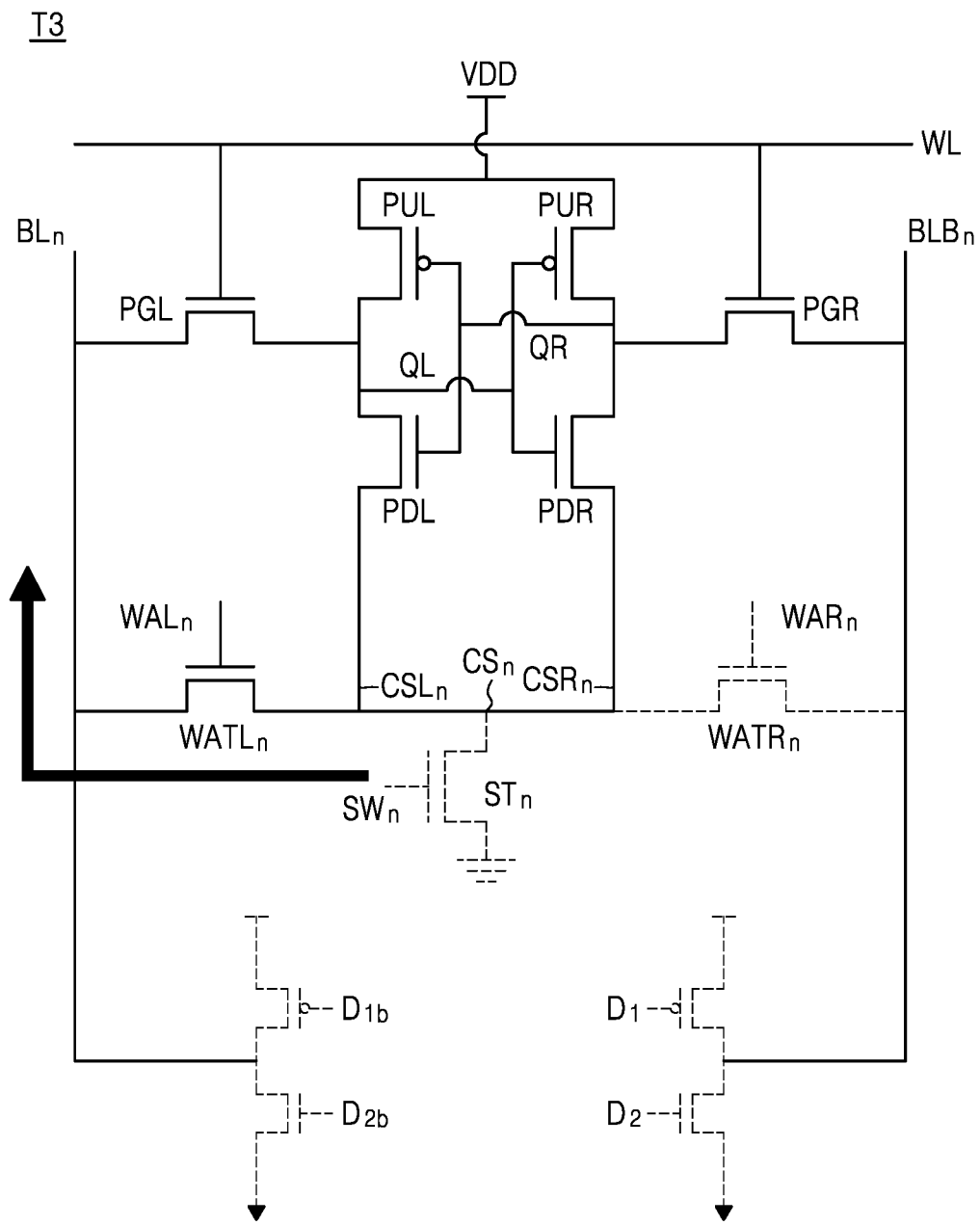

FIG. 6 is a circuit diagram illustrating an operation of the SRAM device 10 in the first time interval T1 for writing data at a logic low level, FIG. 7 is a circuit diagram illustrating an operation of the SRAM device 10 in the second time interval T2, and FIG. 8 is a circuit diagram illustrating an operation of the SRAM device 10 in the third time interval T3.

Referring to FIGS. 4 to 6, the SRAM device 10 may apply a voltage at a logic low level to the bit line $BL_n$ and a voltage at a logic high level to the complementary bit line $BLB_n$ in order to write the data of '0' bit. In the first time interval T1, the SRAM device 10 may transit a first write assist signal WAL$_n$ applied to the charge storage circuit 12 to a logic high level and may transit the switching signal SW$_n$ applied to the charge storage circuit 12 to a logic low level. As the switching signal SW$_n$ is transited to the logic low level, connection between the charge storage node CS$_n$ and the ground may be blocked and a first write assist transistor WATL$_n$ connected to the bit line BL$_n$ may be activated by the first write assist signal WAL$_n$ at the logic high level. Therefore, the voltage of the bit line BL$_n$ may be applied to the charge storage node CS$_n$ and, as the connection between the charge storage node CS$_n$ and the ground is blocked, charges of the bit line BL$_n$ and the charge storage node CS$_n$ may be shared. That is, a voltage level of one end of each of the first pull-down transistor PDL and the second pull-down transistor PDR of the memory cell in which the data is to be written may increase from a logic low level by a certain voltage level.

In the first time interval T1, the SRAM device 10 may activate a first p-channel metal-oxide semiconductor (PMOS) transistor by transiting a voltage of a gate signal D$_1$ of the first PMOS transistor to a logic low level so that a voltage of the complementary bit line BLB$_n$ may be maintained to be at a logic high level.

Referring to FIG. 7, in the second time interval T2, the SRAM device 10 may deactivate the first write assist transistor WATL$_n$ by transiting the first write assist signal WAL$_n$ from a logic high level to a logic low level. Therefore, the SRAM device 10 may block connection between the charge storage node CS$_n$ and the bit line BL$_n$ and the complementary bit line BLB$_n$ and, because the switching signal SW$_n$ is maintained to be at a logic low level, the charge storage circuit 12 may continuously store the charges received from the bit line BL$_n$ in the charge storage node CS$_n$. In the second time interval T2, the SRAM device 10 may activate a second n-channel MOS (NMOS) transistor by transiting a voltage of a gate signal D$_{2b}$ of the second NMOS transistor to a logic high level. Therefore, the SRAM device 10 may write the data of '0' bit in the memory cell in which the data is to be written by pulling down the voltage of the bit line BL$_n$ to the logic low level.

In an SRAM device according to a comparative embodiment, pull-down transistors PD included in a memory cell in which data is to be written may be directly connected to a ground. At this time, when the first node QL of the memory cell in which the data is to be written is maintained to be at a logic high level so that data of '1' bit is stored in the memory cell in which the data is to be written, because the second pull-down transistor PDR connected to the second node QR receives a voltage of the first node QL as a gate voltage, the second node QR may be maintained to be at a ground level. Therefore, the first pull-up transistor PUL configured by a PMOS transistor receiving a voltage of the second node QR at the ground level as a gate voltage may strongly pull up the first node QL to a logic high power voltage level. In a process in which the SRAM device inverts the data of '1' bit stored in the memory cell into the data of '0' bit and writes the data of '0' bit in the memory cell, because the first node QL is strongly pulled up to a logic high level, the SRAM device 10 may spend a large amount of energy on dropping a voltage level of the first node QL to a logic low level.

On the other hand, the SRAM device 10 according to an embodiment of the inventive concept may perform the write operation in a state in which charges are accumulated in the charge storage node CS$_n$ by a certain voltage level without directly connecting one end of the pull-down transistor PD to the ground in order to perform the write operation. That is, a voltage level of the second node QR is higher than a voltage level of the ground so that the first pull-up transistor PUL connected to the first node QL may weakly pull up the first node QL in comparison with the comparative embodiment. Therefore, in the process in which the SRAM device 10 according to an embodiment of the inventive concept inverts the data of '1' bit stored in the memory cell into the data of '0' bit and writes the data of '0' bit in the memory cell, because the first node QL is weakly pulled up to a logic high level, the SRAM device 10 may spend a less amount of energy on dropping the voltage level of the first node QL to the logic low level in comparison with the comparative embodiment in order to perform the write assist operation.

Referring to FIG. 8, after the SRAM device 10 writes the data of '0' bit in the memory cell in which the data is to be written by providing a voltage at a logic low level to the first node QL of the memory cell in which the data is to be written and providing a voltage at a logic high level to the second node QR of the memory cell in which the data is to be written, in the third time interval T3, the SRAM device 10 may provide the charges stored in the charge storage node CS$_n$ to the bit line BL$_n$ before performing a precharge operation. In the third time interval T3, as a voltage level of the word line WL connected to the memory cell in which the data is to be written is transited to a logic low level, the SRAM device 10 may block the connection between the memory cell in which the data is to be written and the bit line BL$_n$ and the complementary bit line BLB$_n$. As the voltage of the gate signal D$_1$ of the first PMOS transistor of the write drive circuit 14 is transited to a logic high level and the voltage of the gate signal D$_{2b}$ of the second NMOS transistor is transited to a logic low level, the SRAM device 10 may block the voltage applied to the bit line BL$_n$ and the complementary bit line BLB$_n$ in order to perform the write operation.

In the third time interval T3, the SRAM device 10 may activate the first write assist transistor WATL$_n$ by applying the first write assist signal WAL$_n$ at the logic high level to the first write assist transistor WATL$_n$. Because one end of the first write assist transistor WATL$_n$ is connected to the bit line BL$_n$ pulled down to a logic low level in order to write the data of '0' bit and the other end of the first write assist transistor WATL$_n$ is connected to the charge storage node CS$_n$ at a voltage level increasing from the ground level by a certain voltage level, the charges of the charge storage node CS$_n$ may be provided to the bit line BL$_n$. That is, after the third time interval T3, in a process of precharging the bit line BL$_n$ and the complementary bit line BLB$_n$ to a logic high level, the SRAM device according to the comparative embodiment spends a large amount of energy in order to pull up a voltage level from the ground level to the logic high level. On the other hand, according to an embodiment of the inventive concept, because the voltage level of the bit line BL$_n$ increases from the ground level by a certain voltage level in the third time interval T3, the SRAM device 10 may spend a less amount of energy on precharging the voltage of the bit line BL$_n$ in comparison with the comparative embodiment.

In the SRAM device 10 according to the current embodiment, the ground may not be directly connected to one end of each of the pull-down transistors PD and the charge storage node CS$_n$ receiving the charges from one of the bit line BL$_n$ and the complementary bit line BLB$_n$ may be connected to one end of each of the pull-down transistors PD. Therefore, referring to FIGS. 4 to 8, the SRAM device 10 may perform the write assist operation when data at a logic level inverted from the data written in the memory cell is written in the memory cell in the second time interval T2 and may provide the charges from the charge storage node $CS_n$ to the bit line $BL_n$ at the logic low level in the third time interval T3 so that energy for precharging the voltage of the bit line $BL_n$ to the logic high level may be saved.

Accordingly, as described hereinabove with respect to FIGS. 1-8, an integrated circuit memory device 10 includes a static random access memory (SRAM) cell, which may be a six transistor (6T) cell connected to a word line WL and a pair of bit lines BL, BLB, as shown by FIG. 2. The six transistors include a pair of pass gate transistors PGL, PGR (a/k/a/ "access" transistors), a pair of PMOS pull-up transistors PUL, PUR, and a pair of NMOS pull-down transistors PDL, PDR. A charge storing circuit 12 is provided, which is electrically coupled to the pair of bit lines BL, BLB, a source terminal of a first NMOS pull-down transistor (PDL) within the SRAM cell (e.g., on line CSL), and a source terminal of a second NMOS pull-down transistor (PDR) within the SRAM cell (e.g., on line CSR). A switching controller 16 is provided, which is electrically coupled to the charge storing circuit 12. This switching controller 16 is configured to save power by recycling bit line charge, by driving the charge storing circuit 12 with: (i) first signals (WAL, WAR, SW) that enable a forward transfer of charge from a first of the pair of bit lines (e.g., BL) to the source terminals of the first and second NMOS pull-down transistors (PDL, PDR) during a portion of the write operation (e.g., when WL=1), and (ii) second signals (WAL, WAR, SW) that enable a reverse transfer of the charge to the first of the pair of bit lines (BL) upon completion of the write operation (when WL switches 1→0). In some embodiments, the source terminal of one of the first and second NMOS pull-down transistors (PDL, PDR) is electrically floated during a portion of the write operation. The write operation may also commence during the forward transfer of charge from a first of the pair of bit lines to the source terminals of the first and second NMOS pull-down transistors (e.g., $WAL_n$ switches 0→1 at T1 before WL switches 0→1). The charge storing circuit 12 may also include a write assist transistor WAT having a gate terminal responsive to a corresponding one of the first signals and a corresponding one of the second signals. This write assist transistor WAT may electrically short the first of the pair of bit lines to the source terminals of the first and second NMOS pull-down transistors during the forward and reverse transfers of the charge. For example, as shown by the timing diagram of FIG. 4, the switching of $WAL_n$ from 0→1 at the beginning of T1 and T3 causes the bit line BL to be electrically "shorted" to the corresponding charge storage node CS (and lines CSL, CSR).

Figure 9:
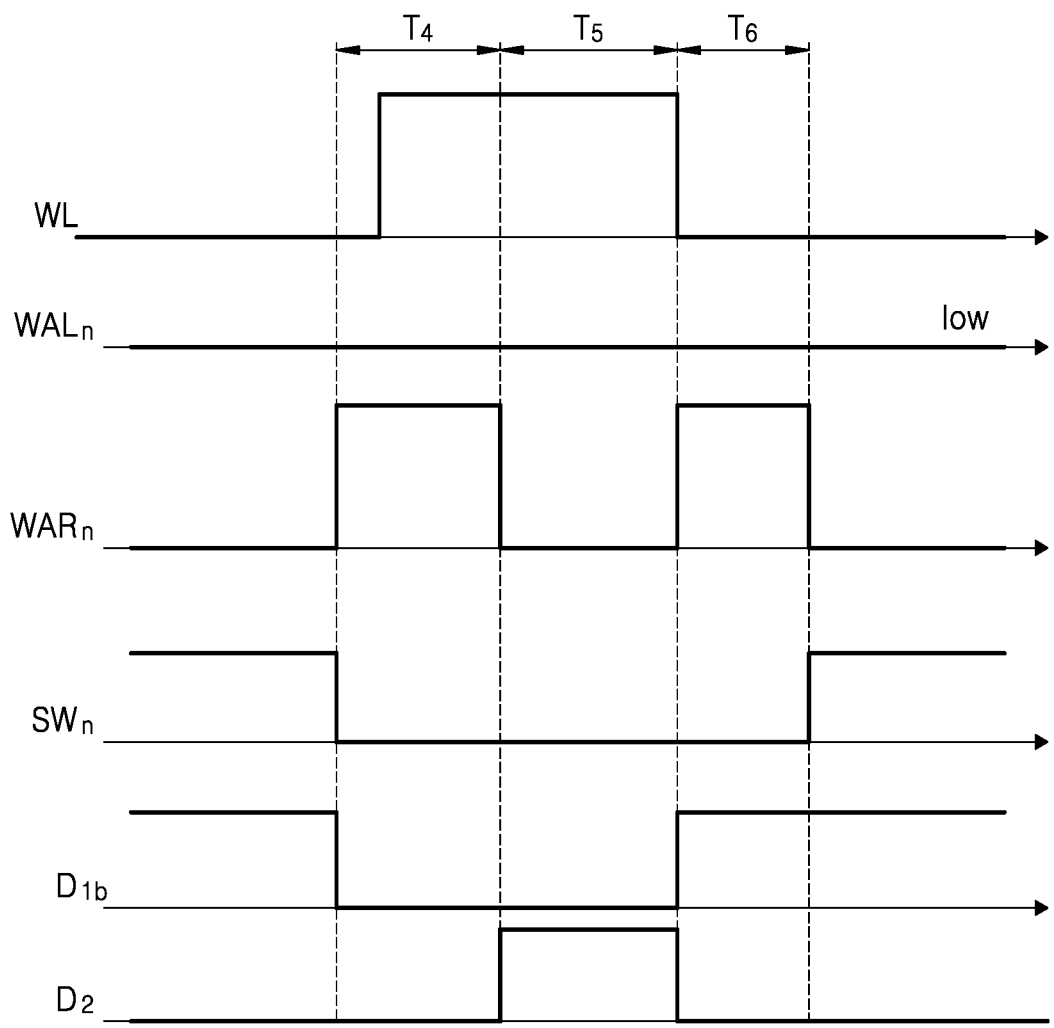
FIG. 9 is a graph illustrating levels of signals applied to an SRAM device in order to write data at a logic high level (e.g., "1")
Figure 10:
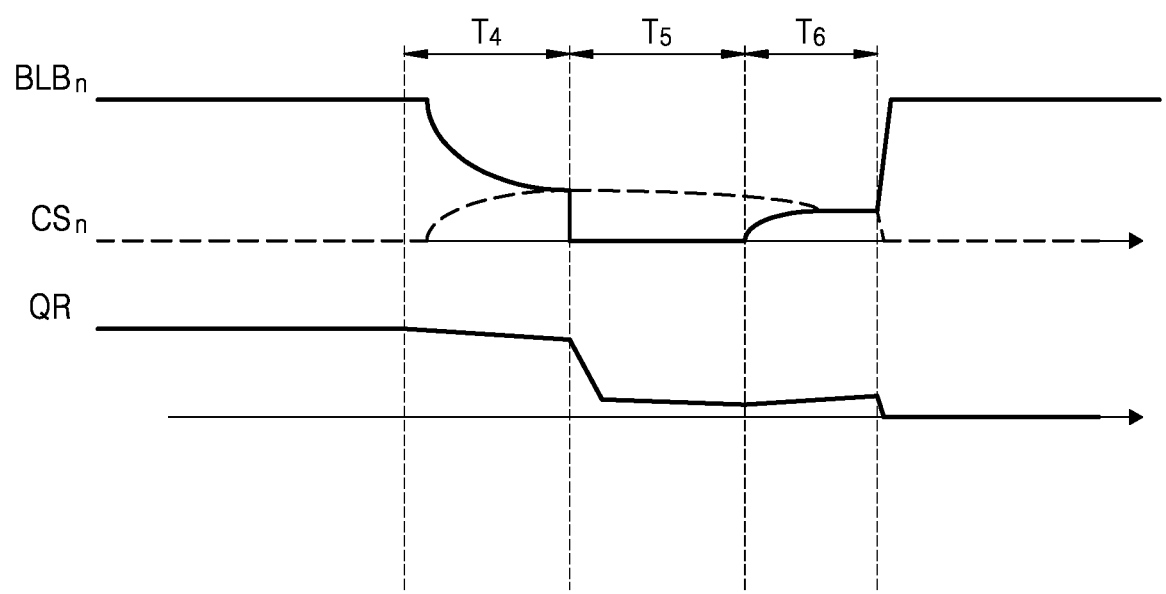
FIG. 10 is a graph illustrating levels of signals applied to a bit line, a charge storage node, and a data storage area of a memory cell according to an embodiment of the inventive concept.

FIG. 9 is a graph illustrating levels of signals applied to then SRAM device 10 in order to write data at a logic high level (e.g., logic "1"). FIG. 10 is a graph illustrating levels of signals applied to the bit line $BL_n$, the charge storage node $CS_n$, and the data storage area of the memory cell according to an embodiment of the inventive concept.

Referring to FIGS. 9 and 10, the SRAM device 10 may apply the word line selection voltage at the logic high level to the word line WL connected to the memory cell in which the data is to be written in order to write the data of '1' bit in the memory device in which the data is to be written and may drop the complementary bit line $BLB_n$ precharged to a logic high level to a logic low level. At this time, the charge storage circuit 12 according to the inventive concept may perform the write assist operation by receiving the charges from the complementary bit line $BLB_n$ and storing the received charges.

In a fourth time interval T4, the SRAM device 10 may block the connection between the charge storage node $CS_n$ and the ground and may float the charge storage node $CS_n$ by applying the switching signal $SW_n$ at the logic low level in order to perform the write assist operation. In a fifth time interval T5, the SRAM device 10 may write the data of '1' bit in the memory cell in which the data is to be written by blocking the connection between the bit line $BL_n$ and the complementary bit line $BLB_n$ and the charge storage node $CS_n$ and pulling down the voltage of the complementary bit line $BLB_n$ to a logic low level. In a sixth time interval T6, the SRAM device 10 may block the connection between the memory cell in which the data is to be written and the bit line $BL_n$ and the complementary bit line $BLB_n$ and may activate the connection between the charge storage node $CS_n$ and the complementary bit line $BLB_n$. Therefore, the SRAM device 10 may provide the charges accumulated in the charge storage node $CS_n$ to the complementary bit line $BLB_n$ pulled down to the logic low level.

Figure 11:
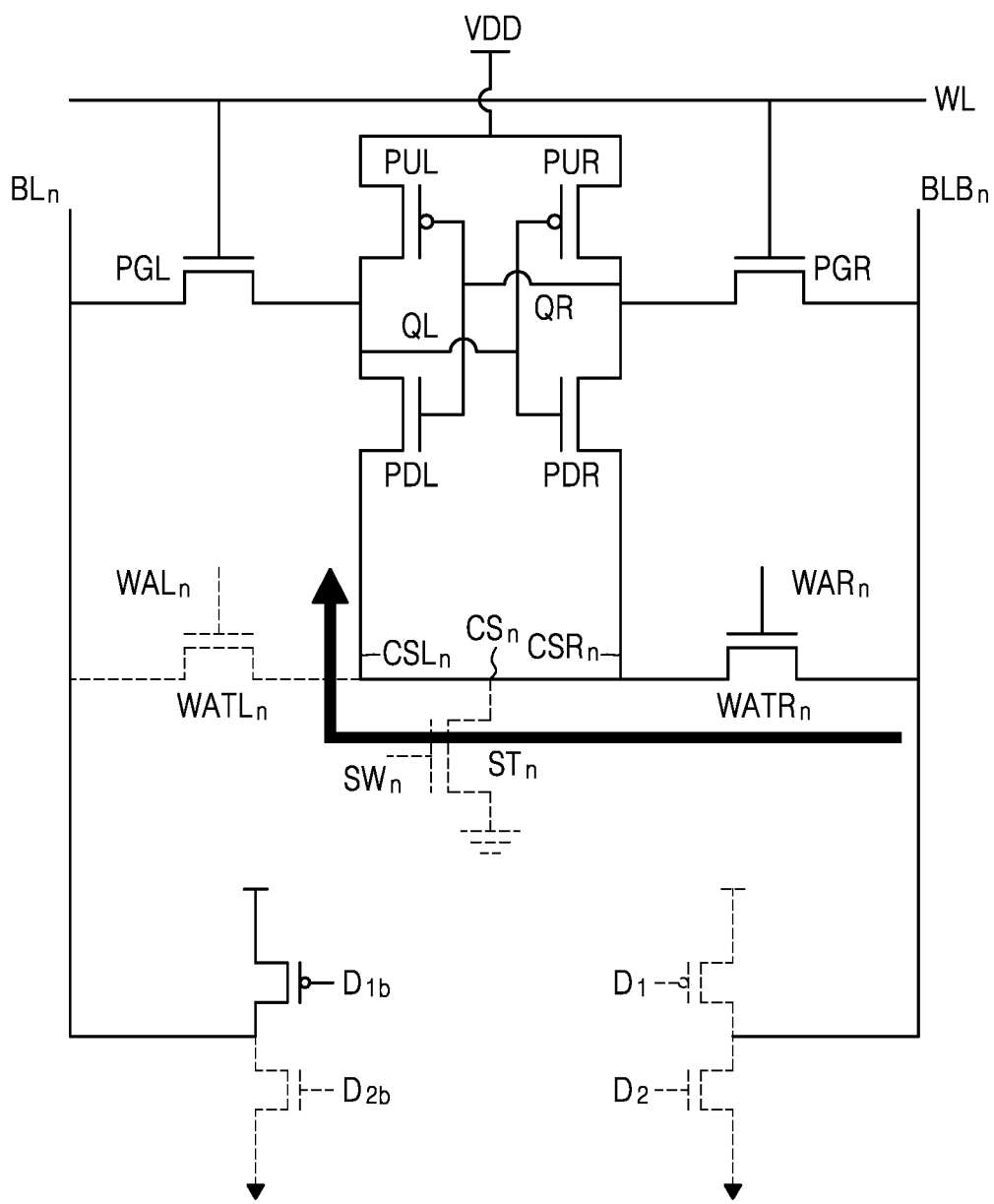
FIGS. 11 to 13 are circuit diagrams illustrating an operation of an SRAM device at fourth to sixth time intervals for writing data at a logic high level according to an embodiment of the inventive concept.
Figure 12:
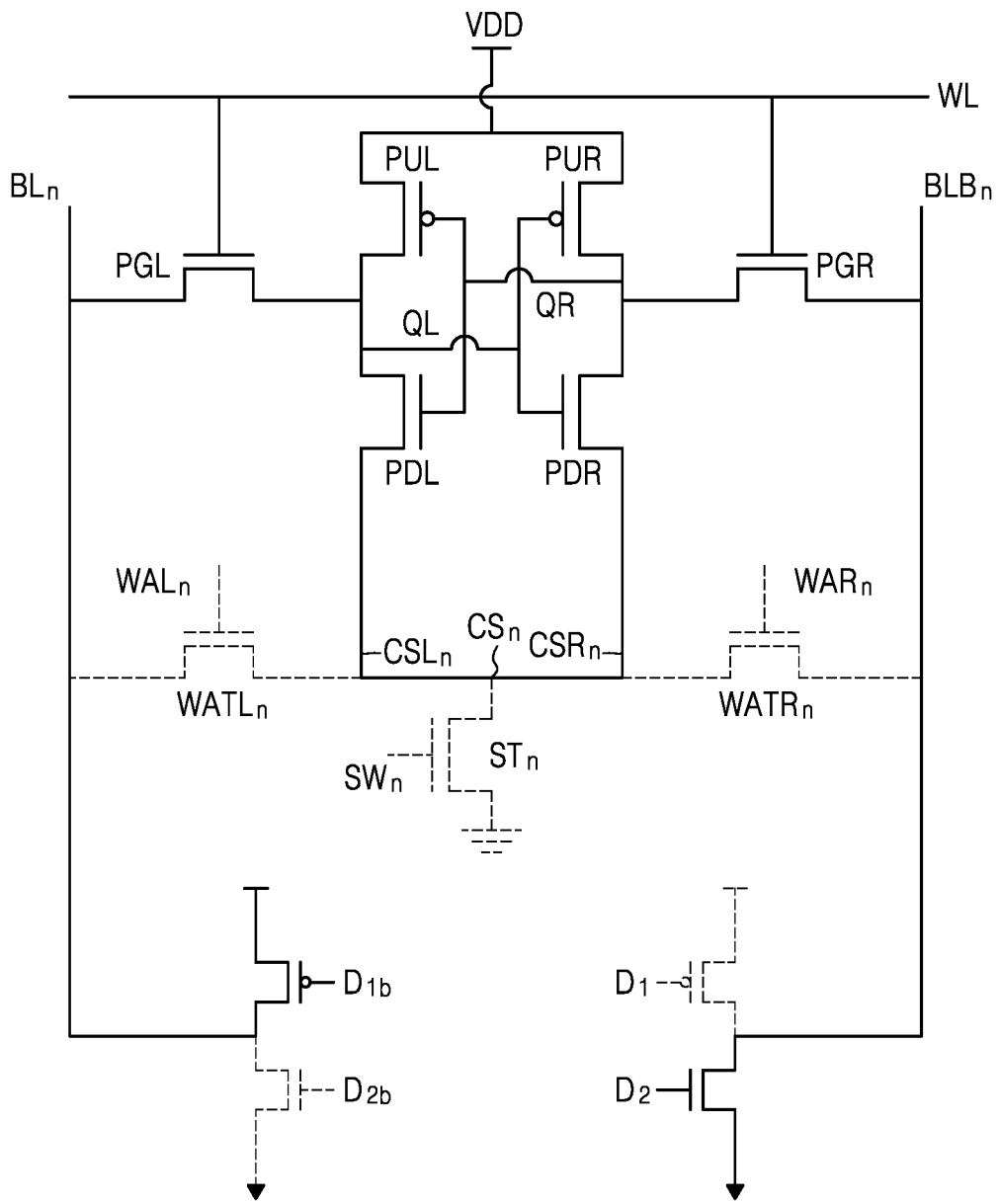
Figure 13:
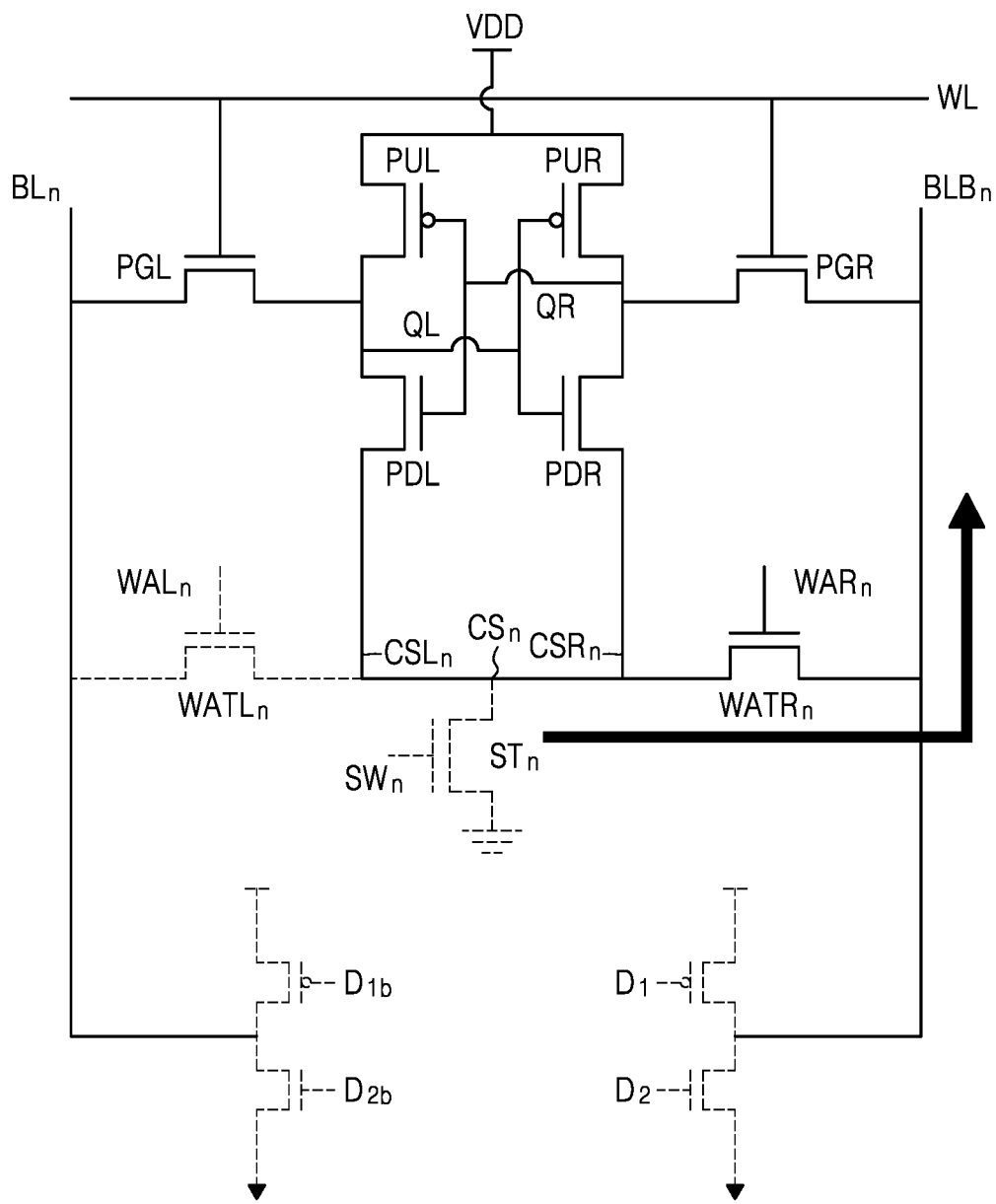

FIG. 11 is a circuit diagram illustrating an operation of the SRAM device 10 in the fourth time interval T4 for writing data at a logic high level, FIG. 12 is a circuit diagram illustrating an operation of the SRAM device 10 in the fifth time interval T5, and FIG. 13 is a circuit diagram illustrating an operation of the SRAM device 10 in the sixth time interval T6.

Referring to FIGS. 9 to 11, the SRAM device 10 may apply a voltage at a logic high level to the bit line $BL_n$ and a voltage at a logic low level to the complementary bit line $BLB_n$ in order to write the data of '1' bit. In the fourth time interval T4, the SRAM device 10 may transit a second write assist signal $WAR_n$ applied to the charge storage circuit 12 to a logic high level and may transit the switching signal $SW_n$ to a logic low level. As the switching signal $SW_n$ is transited to the logic low level, the connection between the charge storage node $CS_n$ and the ground may be blocked and a second write assist transistor $WATR_n$ connected to the bit line $BL_n$ may be activated by the second write assist signal $WAR_n$ at the logic high level. Therefore, the voltage of the complementary bit line $BLB_n$ may be applied to the charge storage node $CS_n$ and charges of the complementary bit line $BLB_n$ and the charge storage node $CS_n$ may be shared by blocking the connection between the charge storage node $CS_n$ and the ground. That is, the voltage level of one end of each of the first pull-down transistor PDL and the second pull-down transistor PDR of the memory cell in which the data is to be written may also increase from the logic low level by a certain voltage level.

In the fourth time interval T4, the SRAM device 10 may activate a second PMOS transistor by transiting a voltage of a gate signal $D_{1b}$ of the second PMOS transistor to a logic low level so that the voltage of the bit line $BL_n$ may be maintained to be at a logic high level.

Referring to FIG. 12, in the fifth time interval T5, the SRAM device 10 may deactivate the second write assist transistor $WATR_n$ by transiting the second write assist signal $WAR_n$ from a logic high level to a logic low level. Therefore, the SRAM device 10 may block the connection between the bit line $BL_n$ and the complementary bit line $BLB_n$ and the charge storage node $CS_n$ and, because the switching signal $SW_n$ is maintained to be at the logic low level, the charge storage circuit 12 may continuously store the charges received from the bit line $BL_n$ in the charge storage node $CS_n$. In the fifth time interval T5, the SRAM device 10 may activate a first NMOS transistor by transiting a voltage of a gate signal $D_2$ of the first NMOS transistor. Therefore, the SRAM device 10 may write the data of '1' bit in the memory cell in which the data is to be written by pulling down the voltage of the complementary bit line $BLB_n$ to the logic low level.

Referring to FIG. 13, after the SRAM device 10 writes the data of '1' bit in the memory cell in which the data is to be written by providing a voltage at a logic high level to the first node QL of the memory cell in which the data is to be written and providing a voltage at a logic low level to the second node QR of the memory cell in which the data is to be written, in the sixth time interval T6, the SRAM device 10 may provide the charges stored in the charge storage node $CS_n$ to the complementary bit line $BLB_n$ before performing the precharge operation. In the sixth time interval T6, as the voltage level of the word line WL connected to the memory cell in which the data is to be written is transited to the logic low level, the SRAM device 10 may block the connection between the memory cell in which the data is to be written and the bit line $BL_n$ and the complementary bit line $BLB_n$. As the voltage of the gate signal $D_{1b}$ of the second PMOS transistor of the write drive circuit 14 is transited to a logic high level and the voltage of the gate signal $D_2$ of the first NMOS transistor is transited to a logic low level, the SRAM device 10 may block the voltage applied to the bit line $BL_n$ and the complementary bit line $BLB_n$ in order to perform the write operation.

In the sixth time interval T6, the SRAM device 10 may activate the second write assist transistor $WATR_n$ by applying the second write assist signal $WAR_n$ at the logic high level to the second write assist transistor $WATR_n$. Because one end of the second write assist transistor $WATR_n$ is connected to the complementary bit line $BLB_n$ pulled down to a logic low level in order to write the data of '1' bit and the other end of the second write assist transistor $WATR_n$ is connected to the charge storage node $CS_n$ at the voltage level increasing from the ground level by a certain voltage level, the charges of the charge storage node $CS_n$ may be provided to the complementary bit line $BLB_n$. That is, after the sixth time interval T6, in a process of precharging the bit line $BL_n$ and the complementary bit line $BLB_n$ to the logic high level, the SRAM device according to the comparative embodiment spends a large amount of energy in order to pull up the voltage level from the ground level to the logic high level. On the other hand, according to an embodiment of the inventive concept, because the voltage level of the complementary bit line $BLB_n$ increases from the ground level by a certain voltage level in the sixth time interval T6, the SRAM device 10 may spend a less amount of energy on precharging the voltage of the complementary bit line $BLB_n$ in comparison with the comparative embodiment. In the SRAM device 10 according to the current embodiment, as described above with reference to FIGS. 4 to 8, the write assist operation may also be performed in a process of writing the data of '1' bit and energy for precharging the complementary bit line $BLB_n$ may be saved.

Figure 14:
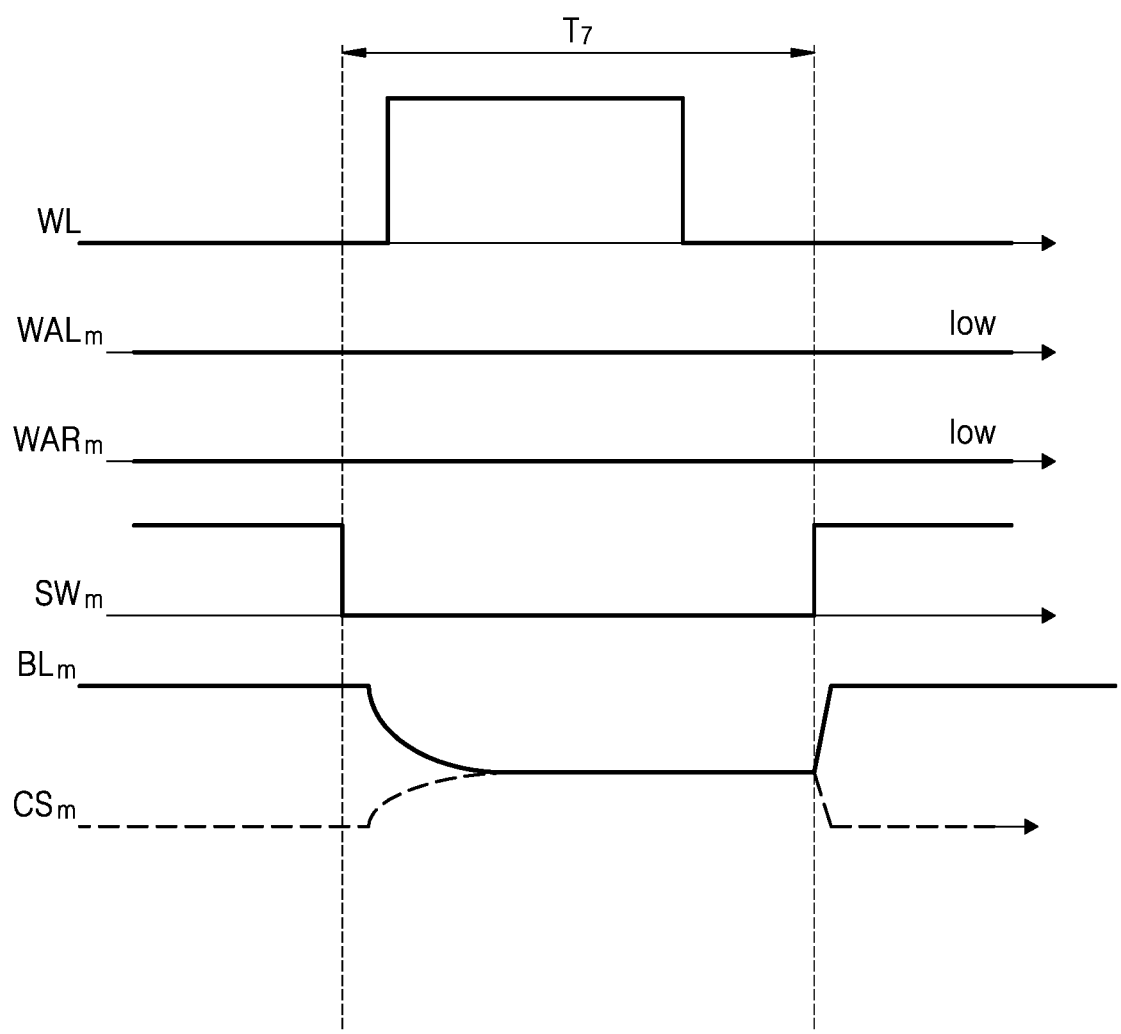
FIG. 14 is a graph illustrating signals applied to non-selective memory cells according to an embodiment of the inventive concept.
Figure 15:
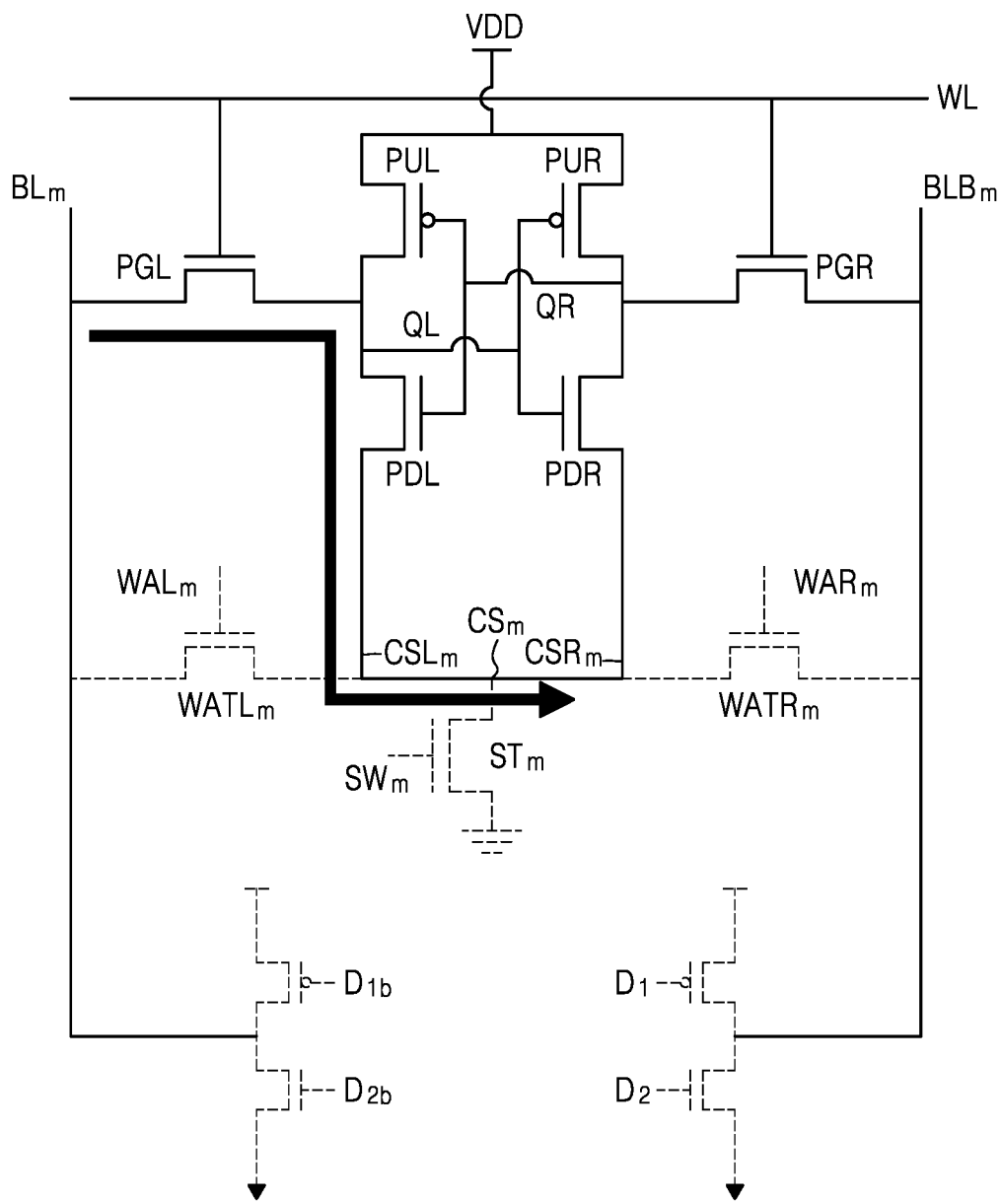
FIG. 15 is a circuit diagram illustrating an operation of an SRAM device for storing charges in non-selective memory cells according to an embodiment of the inventive concept.

FIG. 14 is a graph illustrating signals applied to non-selective memory cells according to an embodiment of the inventive concept and FIG. 15 is a circuit diagram illustrating an operation of the SRAM device 10 for storing charges in non-selective memory cells according to an embodiment of the inventive concept.

The SRAM device 10 according to an embodiment of the inventive concept may perform a precharge assist operation by partially storing charges of a bit line $BL_m$ or a complementary bit line $BLB_m$ in the charge storage circuit 12 connected to the non-selective memory cells when the write operation or the read operation is performed. The non-selective memory cells may be memory cells sharing a word line among the memory cells excluding the memory cell on which the write operation or the read operation is to be performed. That is, the memory cell on which the write operation or the read operation is to be performed may be connected to a column activated by the column selection circuit 13 and the non-selective memory cells may be connected to deactivated columns.

Referring to FIGS. 14 and 15, the SRAM device 10 may also provide the word line selection voltage to the non-selective memory cells sharing the word line WL with the memory cell on which the write operation or the read operation is to be performed in order to apply the word line selection voltage to the memory cell on which the write operation or the read operation is to be performed. Therefore, a pass gate transistor PG of a non-selective memory cell may be activated and charges of a bit line BL or a complementary bit line BLB may be provided to the non-selective memory cell. In a seventh time interval T7, the SRAM device 10 may provide a switching signal $SW_m$ at a logic low level to the charge storage circuit 12 connected to the non-selective memory cell and a switching transistor $ST_m$ receiving the switching signal $SW_m$ at the logic low level blocks connection between a ground and a charge storage node $CS_m$ so that the SRAM device 10 may store the charges provided from the bit line $BL_m$ or the complementary bit line $BLB_m$. Therefore, a voltage at a level increasing from a ground level by a certain voltage level may be formed in the bit line $BL_m$ or the complementary bit line $BLB_m$ connected to the non-selective memory cells. FIGS. 14 and 15 illustrate an embodiment in which charges of the bit line $BL_m$ are shared with the charge storage node $CS_m$ through a first node $QL_m$ connected to the bit line $BL_m$ in a state in which the data of '0' bit is written in the non-selective memory cells. However, the SRAM device 10 according to the inventive concept is not limited thereto and an embodiment in which the charges of the complementary bit line $BLB_m$ are shared with the charge storage node $CS_m$ may be included.

According to a comparative embodiment, in accordance with a state in which data is written in a non-selective memory cell, one of the bit line $BL_m$ and the complementary bit line $BLB_m$ is connected to a ground connected to one end of the non-selective memory cell so that the bit line $BL_m$ or the complementary bit line $BLB_m$ may be transited to a ground voltage level. Therefore, an SRAM device according to a comparative embodiment spends a large amount of energy in order to precharge the bit line $BL_m$ or the complementary bit line $BLB_m$ at the ground level to a voltage at a logic high level. On the other hand, in the seventh time interval T7, the SRAM device 10 according to the inventive concept may increase the voltage level of the bit line $BL_m$ or the complementary bit line $BLB_m$ from the ground level by a certain voltage level by blocking connection between the non-selective memory cell and the ground. Therefore, after the seventh time interval T7, the SRAM device 10 according to an embodiment of the inventive concept may precharge the bit line $BL_m$ and the complementary bit line $BLB_m$ by a less amount of energy in comparison with the comparative embodiment.

The SRAM device 10 according to the inventive concept may accumulate charges of the bit line BL or the complementary bit line BLB in a charge storage node CS by controlling the charge storage circuit 12 connected to a memory cell to include the switching transistor ST and to block the connection between the ground and the memory cell in accordance with a logic level of a gate signal applied to the switching transistor ST. Therefore, the SRAM device 10 may perform the write assist operation and the precharge assist operation on the memory cell on which the write operation is to be performed by accumulating the charges in the charge storage node CS and may perform the precharge assist operation on the non-selective memory cells excluding the memory cell on which the precharge assist operation is to be performed.

While the inventive concept has been particularly shown and described with reference to embodiments thereof, it will be understood that various changes in form and details may be made therein without departing from the spirit and scope of the following claims.

What is claimed is:

1. An integrated circuit memory device, comprising:
   a static random access memory (SRAM) cell connected to a word line and a pair of bit lines;
   a charge storing circuit electrically coupled to the SRAM cell, said charge storing circuit comprising a pull-down switching transistor electrically coupled between a charge storage node, which is electrically shorted to first and second current-carrying terminals of the SRAM cell, and a ground reference line; and
   a switching controller electrically coupled to said charge storing circuit, said switching controller configured to turn off the pull-down switching transistor during a write operation while charge is transferred between a first of the pair of bit lines and the charge storage node;
   wherein the charge storage circuit further comprises a first write assist transistor electrically coupled between the first of the pair of bit lines and the charge storage node; and
   wherein the switching controller is further configured to turn on the first write assist transistor to enable a forward transfer of the charge from the first of the pair of bit lines to the charge storage node while the pull-down switching transistor is turned off.

2. The memory device of claim 1, wherein the switching controller is further configured to turn on the first write assist transistor upon completion of the write operation, to thereby enable a reverse transfer of the charge from the charge storage node to the first of the pair of bit lines.

3. The memory device of claim 2, wherein the switching controller is further configured to turn off the first write assist transistor during a tail portion of the write operation; and wherein the write operation commences when the word line switches from an inactive logic level to an active logic level and terminates when the word line next switches from the active logic level to the inactive logic level.

4. The memory device of claim 1, wherein the SRAM cell comprises first and second NMOS pull-down transistors having source terminals electrically connected together via the charge storing circuit; and wherein the source terminal of one of the first and second NMOS pull-down transistors is electrically floated during a portion of the write operation.

5. The memory device of claim 1, wherein the SRAM cell comprises first and second NMOS pull-down transistors having source terminals electrically connected to a drain terminal of the pull-down switching transistor; and wherein the source terminals of one of the first and second NMOS pull-down transistors and the drain terminal of the switching transistor is electrically floated during a portion of the write operation.

6. The memory device of claim 1, wherein the SRAM cell comprises first and second inverters connected in anti-parallel; and wherein the charge storage node is directly connected in common to: (i) a source terminal of a pull-down transistor within the first inverter, and (ii) a source terminal of a pull-down transistor within the second inverter.

7. An integrated circuit memory device, comprising:
   a static random access memory (SRAM) cell connected to a word line and a pair of bit lines;
   a charge storing circuit electrically coupled to the pair of bit lines, a source terminal of a first NMOS pull-down transistor within the SRAM cell, and a source terminal of a second NMOS pull-down transistor within the SRAM cell; and
   a switching controller electrically coupled to said charge storing circuit, said switching controller configured to recycle bit line charge by driving said charge storing circuit with: (i) first signals that enable a forward transfer of charge from a first of the pair of bit lines to the source terminals of the first and second NMOS pull-down transistors during a portion of the write operation, and (ii) second signals that enable a reverse transfer of the charge to the first of the pair of bit lines upon completion of the write operation.

8. The memory device of claim 7, wherein the source terminal of one of the first and second NMOS pull-down transistors is electrically floated during a portion of the write operation.

9. The memory device of claim 7, wherein the write operation commences during the forward transfer of charge from a first of the pair of bit lines to the source terminals of the first and second NMOS pull-down transistors.

10. The memory device of claim 7, wherein the charge storing circuit comprises a write assist transistor having a gate terminal responsive to a corresponding one of the first signals and a corresponding one of the second signals; and wherein the write assist transistor electrically shorts the first of the pair of bit lines to the source terminals of the first and second NMOS pull-down transistors during the forward and reverse transfers of the charge.

11. A static random access memory (SRAM) device, comprising:
    a memory cell connected to a word line and bit lines intersecting the word line;
    a charge storage circuit including a pull-down switching transistor connected to the memory cell and controlled to block a connection between ground and the memory cell in accordance with a logic level of a gate signal, the charge storage circuit accumulating charges at a charge storage node from at least one bit line among the bit lines when the connection between the ground and the memory cell is blocked; and
    a switching controller controlling the charge storage circuit by determining the logic level of the gate signal of the pull-down switching transistor;
    wherein the charge storage circuit comprises a write assist transistor that is connected to a bit line connected to the memory cell, and controlled to block a connection to the charge storage node in accordance with a logic state of a signal received by a gate terminal of the write assist transistor.

12. The SRAM device of claim 11, wherein the memory cell determines a logic state of data to be stored therein according to a voltage received in a first logic state through a first bit line connected to one side thereof and a voltage received in a second logic state different from the first logic state through a second bit line connected to the other side thereof.

13. The SRAM device of claim 12, wherein the charge storage circuit comprises:

a first write assist transistor connected to the first bit line; and a second write assist transistor connected to the second bit line, and wherein the switching controller activates one of the first write assist transistor and the second write assist transistor as a write assist transistor on which a write operation is to be performed in accordance with a logic state of data written in the memory cell when the write operation is performed on the memory cell.

14. The SRAM device of claim 11, wherein the switching controller controls the charge storage circuit so that charges of a bit line connected to the charge storage node and the write assist transistor on which the write operation is to be performed are shared and the charges are stored in the charge storage node by activating the write assist transistor on which the write operation is to be performed when the write operation is performed on the memory cell.

15. The SRAM device of claim 14, wherein the switching controller deactivates the write assist transistor on which the write operation is to be performed after the charges of the charge storage node and the bit line are shared so that data is written in the memory cell.

16. The SRAM device of claim 15, wherein the switching controller controls the charge storage circuit so that the charges stored in the charge storage node are applied to the bit line by activating the write assist transistor on which the write operation is to be performed when a precharge operation is performed after data is written in the memory cell.

17. The SRAM device of claim 11, wherein the switching controller deactivates the switching transistor when the memory cell is a non-selective memory cell on which a write operation or a read operation is not performed.

18. The SRAM device of claim 11, further comprising a write drive circuit performing a write operation by applying signals in opposite logic states to a first bit line and a second bit line connected to the memory cell.

19. The SRAM device of claim 11, further comprising a column selection circuit controlled to be connected to the write drive circuit when a write operation or a read operation is performed on the memory cell.

20. The SRAM device of claim 11, wherein the memory cell comprises first and second inverters connected in anti-parallel; and wherein the charge storage node is directly connected in common to: (i) a source terminal of a pull-down transistor within the first inverter, and (ii) a source terminal of a pull-down transistor within the second inverter.

* * * * *